(12) United States Patent
Yen et al.

(10) Patent No.: US 9,766,505 B2
(45) Date of Patent: Sep. 19, 2017

(54) DISPLAY PANEL

(71) Applicant: InnoLux Corporation, Miao-Li County (TW)

(72) Inventors: Chung-Wen Yen, Miao-Li County (TW); Chao-Hsiang Wang, Miao-Li County (TW); Shih-Hsiung Wu, Miao-Li County (TW); Huan-Kuang Peng, Miao-Li County (TW); Jui-Chu Lai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/335,596

(22) Filed: Oct. 27, 2016

(65) Prior Publication Data

US 2017/0123246 A1    May 4, 2017

(30) Foreign Application Priority Data

Oct. 28, 2015   (TW) .............................. 104135560 A

(51) Int. Cl.
*G02F 1/1339* (2006.01)
*H01L 51/52* (2006.01)

(52) U.S. Cl.
CPC ........ *G02F 1/1339* (2013.01); *G02F 2201/56* (2013.01); *H01L 51/5246* (2013.01)

(58) Field of Classification Search
CPC . G02F 1/1339; G02F 2201/56; H01L 51/5246
See application file for complete search history.

(56) References Cited

U.S. PATENT DOCUMENTS

| 7,999,468 | B2 * | 8/2011 | Lee ..................... H01L 51/5246 313/505 |
| 2017/0102568 | A1 * | 4/2017 | Zhao ..................... G02F 1/1339 |

\* cited by examiner

*Primary Examiner* — Joseph L Williams
(74) *Attorney, Agent, or Firm* — McClure, Qualey & Rodack, LLP

(57) ABSTRACT

A display panel is provided, which includes a sealant connected between two opposite substrates. A first curved segment of the sealant includes two first sealant nodes. A second curved segment of the sealant includes two second sealant nodes. The radius of the first curved segment is greater than that of the second curved segment. In addition, the distance between the two first sealant nodes is greater than the distance between the two second sealant nodes.

20 Claims, 12 Drawing Sheets

DISPLAY PANEL

CROSS REFERENCE TO RELATED APPLICATIONS

This application claims priority of Taiwan Patent Application No. 104135560, filed on Oct. 28, 2015, the entirety of which is incorporated by reference herein.

BACKGROUND

Field of the Invention

The present disclosure relates to an electronic device, and more particularly to an electronic display panel with non-rectangular shape and a method for processing the display panel.

Description of the Related Art

An electronic display is an optoelectronic device that is able to transfer electric signals into visible images so that human beings can see the information contained in the electronic signals. Recently, liquid-crystal displays, organic electro luminescence displays and light-emitting diode display have grown in popularity.

Because of their slimness, low power consumption and low radiation, these image-display devices have been widely used in portable electronic devices such as TV, desktop computers, notebook computers, tablet, and mobile phones, and are even gradually replacing cathode ray tube (CRT) monitors and conventional TVs.

SUMMARY

In accordance with some embodiments of the disclosure, a display panel includes a first substrate, a second substrate, a display layer, and a sealant. The first substrate has a display area. The second substrate is arranged opposite to the first substrate. The display layer is positioned between the first substrate and the second substrate. The sealant is positioned between the first substrate and the second substrate and neighboring the display layer. The sealant includes a curved segment. The curved segment includes two sealant nodes The two sealant nodes are spaced apart by a first distance (D), an edge of the display area is spaced apart from an edge of the first substrate by a second distance (d), and the curved segment has a rotation radius (r). The first distance (D), the second distance (d) and the rotation radius (r) satisfy the following equation:

$$0 < D \leq 2\sqrt{d(2r-d)}$$

In accordance with some other embodiments of the disclosure, the two sealant nodes are spaced apart by a first distance (D), and the curved segment has a rotation radius (r). The first distance (D) and the rotation radius (r) satisfy the following equation:

$$0 < D \leq 2\sqrt{200(2r-200)}$$

wherein r and D in unit of micrometer

In some embodiments, the first distance (D) and the rotation radius (r) further satisfy the following equation:

$$2\sqrt{10(2r-10)} \leq D \leq 2\sqrt{200(2r-200)}$$

wherein r and D in unit of micrometer

In accordance with some other embodiments of the disclosure, a display panel includes a first substrate, a second substrate, a display layer and a sealant. The first substrate has a display area. The second substrate is arranged opposite to the first substrate. The display layer is positioned between the first substrate and the second substrate. The sealant is positioned between the first substrate and the second substrate and neighboring the display layer. The sealant includes a first curved segment and a second curved segment. The first curved segment includes two first sealant nodes. The second curved segment includes two second sealant nodes.

The first curved segment has a first rotation radius ($r_1$) and the second curved segment has a second rotation radius ($r_2$). The two first sealant nodes are spaced apart by a first distance ($D_1$), and the two second sealant nodes are spaced apart by a second distance ($D_2$). The first rotation radius ($r_1$) is greater than the second rotation radius ($r_2$), and the first distance ($D_1$) is greater than the second distance ($D_2$).

In the above-mentioned embodiments, the first rotation radius ($r_1$) and the second rotation radius ($r_2$) satisfies the equation: $0 < r_2/r_1 < 1$, and the first distance ($D_1$) and the second distance ($D_2$) satisfies the equation: $0 < D_2/D_1 < 1$.

BRIEF DESCRIPTION OF THE DRAWINGS

For a more complete understanding of the embodiments and the advantages thereof, reference is now made to the following descriptions taken in conjunction with the accompanying drawings.

DESCRIPTION OF THE ILLUSTRATIVE EMBODIMENTS

Figure 1:
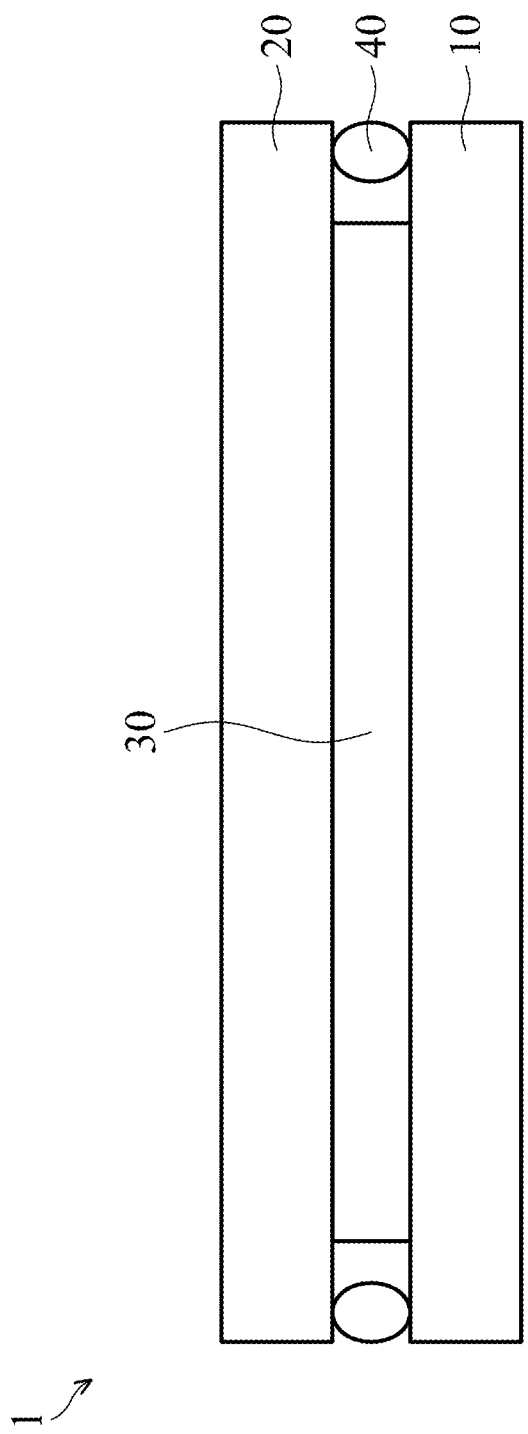
FIG. 1 shows a cross-sectional view of a display panel, in accordance with some embodiments.

The display panel of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. Furthermore, the attached drawings may be drawn in a slightly simplified or exaggerated way for ease of understanding; the numbers, shapes and dimensional scales of elements depicted may not be exactly the same as those in practical implementation and are not intended to limit the present disclosure.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

FIG. 1 shows a cross-sectional view of a display panel 1, in accordance with some embodiments. In some embodiments, the display panel 1 includes a first substrate 10, a second substrate 20, a display layer 30, and a sealant 40. The elements of the display panel 1 can be added or omitted, and the disclosure should not be limited by the embodiment. The first substrate 10 and the second substrate 20 may be a rigid substrate or a flexible substrate. The rigid substrate may comprise but not limit to glass, sapphire or ceramic. The flexible substrate may comprise polyimide (PI), polyethylene terephthalate (PET), polycarbonate (PC), or other suitable organic materials. The display layer 30 may be liquid crystal, organic light-emitting diode, or light emitting diode.

The display panel 1 may be a liquid-crystal panel, such as thin film transistor panel. Alternatively, the display panel 1 may be a twisted nematic (TN) mode liquid-crystal panel, a vertical aligned (VA) mode liquid-crystal panel, an in-plane switching (IPS) mode liquid-crystal panel, a fringe field switching (FFS) mode liquid-crystal panel, a cholesteric mode liquid-crystal panel, a blue phase in-plane switching (IPS) mode liquid-crystal panel, or another suitable liquid-crystal panel. The display panel 1 may be an organic light-emitting diode (OLED) panel, a light-emitting diode (LED) panel, a micro light-emitting diode (micro LED) panel and a quantum dot (QD) panel.

In some embodiments, the second substrate 20 is spaced apart from the first substrate 10 by a distance and covers the first substrate 10. The display layer 30 is positioned between the first substrate 10 and the second substrate 20. The display layer 30 is operated according to electronic signals from the driving unit (not shown in figures) so as to show images. The first substrate 10 may be a thin film transistor (TFT) substrate and include a number of pixels and switching elements. The second substrate 20 may be a color filter substrate or a transparent cover substrate. The first substrate 10 or the second substrate 20 may be equipped with touch functionality.

The sealant 40 is connected between the first substrate 10 and the second substrate 20. The sealant 40 may surround the display layer 30. Or, the sealant 40 may not surround the display layer 30 but may be applied neighboring a portion of the display layer 30. In one embodiment, the sealant 40 is applied on the first substrate 10 (or the second substrate 20) along a path with a rectangular shape or non-rectangular shape. The path is defined according to the shape of the outer edge of the first substrate 10 (or the second substrate 20). Alternatively, the path is defined according to the shape of the display area AA. In one embodiment, the sealant 40 is applied between an edge of the first substrate 10 and an edge of the display area AA. In other words, the sealant 40 is applied on a non-display area. In one embodiment, the non-display area is located between an edge of the first substrate 10 and an edge of the display area AA. In one embodiment, the display area AA is an area where display elements for display images are positioned.

Figure 2:
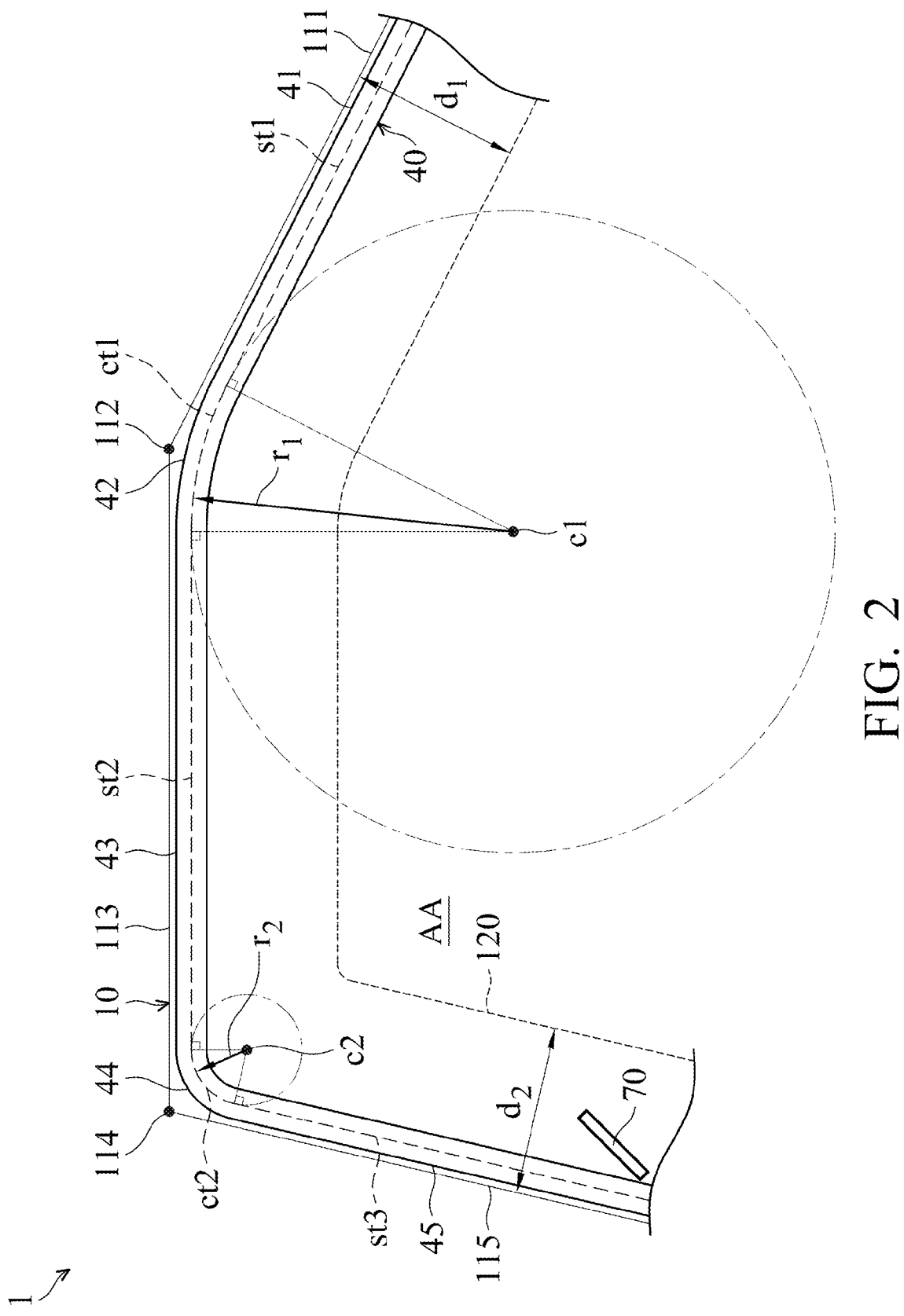
FIG. 2 shows a top view of a portion of elements of a display panel, in accordance with some embodiments.

FIG. 2 shows a top view of a portion of the display panel 1, in accordance with some embodiments. In one embodiment, the first substrate 10 is not rectangular, and it includes a number of lateral edges 111, 113, and 115 which are consecutively connected to one another. The lateral edge 111 connects to the lateral edge 113 via an intersection point 112, and the lateral edge 113 connects to the lateral edge 115 via an intersection point 114. In the embodiment shown in FIG. 2, the included angle formed by the two lateral edges 111 and 113 is larger than the included angle formed by the two lateral edges 113 and 115. In one embodiment, the two lateral edges 113 and 115 are straight, and the included angle is an angle less than 180 degree.

In one embodiment, the sealant 40 is applied on the first substrate 10 along a path with a non-rectangular shape. The path includes a number of straight paths (such as first straight path st1, second straight path st2, and third straight path st3) and a number of curved paths (such as first curved path ct1 and second curved path ct2).

Specifically, during the process of forming the sealant 40, a first straight segment 41 is formed on the first substrate 10 along the first straight path st1, wherein the first straight path st1 is parallel to the lateral edge 111 and spaced apart from the lateral edge 111 by a distance. Afterwards, a curved segment 42 is formed on the first substrate 10 along the first curved path ct1 which is adjacent to the intersection point 112. It should be understood that a "straight segment" means that this segment of the sealant is formed on a substrate along a straight path. Therefore, its shape is substantially straight. Considering the sealant is fluid, the straight segment may also be called a substantially straight segment.

Afterwards, a second straight segment 43 is formed on the first substrate 10 along the second straight path st2, wherein the second straight path st2 is parallel to the lateral edge 113 and spaced apart from the lateral edge 113 by a distance. Afterwards, a curved segment 44 is formed on the first substrate 10 along the second curved path ct2 which is adjacent to the intersection point 114. Afterwards, a third straight segment 45 is formed on the first substrate 10 along the third straight path st3, wherein the third straight path st3 is parallel to the lateral edge 115 and spaced apart from the lateral edge 115 by a distance.

The distance between the first, second, and third straight paths st1, st2, st3 and their corresponding lateral edges 111, 113, and 115 may be the same or different. As shown in FIG. 2, a circle (shown in right hand side of FIG. 2) is tangential to the first straight path st1 and the second straight path st2, wherein the first curved path ct1 is an arc of the circle, and the rotation radius $r_1$ of the curved path ct1 equals to the radius of the circle. In addition, a circle (shown in left hand side of FIG. 2) is tangential to the second straight path st2 and the third straight path st3, wherein the second curved path ct2 is an arc of the circle, and the rotation radius $r_2$ of the curved path ct2 equals to the radius of the circle. In other words, the rotation radius of a curved path is equal to the radius of curvature of the curved path.

During the process of applying the sealant 40 over the first and the second curved paths ct1 and ct2, the movement of a nozzle 70 for applying the sealant 40 is controlled by a controller (such as robot arm, not shown in the figures). However, in some embodiments of the disclosure, the nozzle 70 is not moved along the first and the second curved paths ct1 and ct2 precisely. On the contrary, the nozzle 70 is moved along multiple straight lines, and each straight line is connected by two neighboring nodes on the first curved paths ct1 or the second curved path ct2. Additionally, during the movement of the nozzle 70 along a straight line between two neighboring nodes, the nozzle 70 moves with acceleration that varies. Details of the method for moving the nozzle will be described in the descriptions regarding to the embodiments shown in FIGS. 5 and 7. By controlling the movement of the nozzle 70 among the nodes, the sealant 40 is applied on the first substrate 10 with high efficiency. On the other hand, the manufacturing time required for producing the display panel 1 is reduced.

In the following description, the maximum distance between the straight line connecting two neighboring nodes and its corresponding curved path is defined as a manufacturing variance. In one embodiment, the curved path is an arc. The arc of a circle is constructed by three of the nodes. However, the method of constructing a circle is not limited to the above mentioned method. In the process of applying the sealant 40 over the same curved path, with the increase of the number of nodes, the manufacturing variance is decreased and the shape of the curved segment is highly compatible with the curved path. In this case, a longer manufacturing time is required. On the contrary, with the decrease of the number of nodes, the manufacturing variance is increased and the shape of the curved segment is roughly compatible with the curved path. In this case, however, the sealant 40 can be applied with a shorter manufacturing time.

Figure 3:
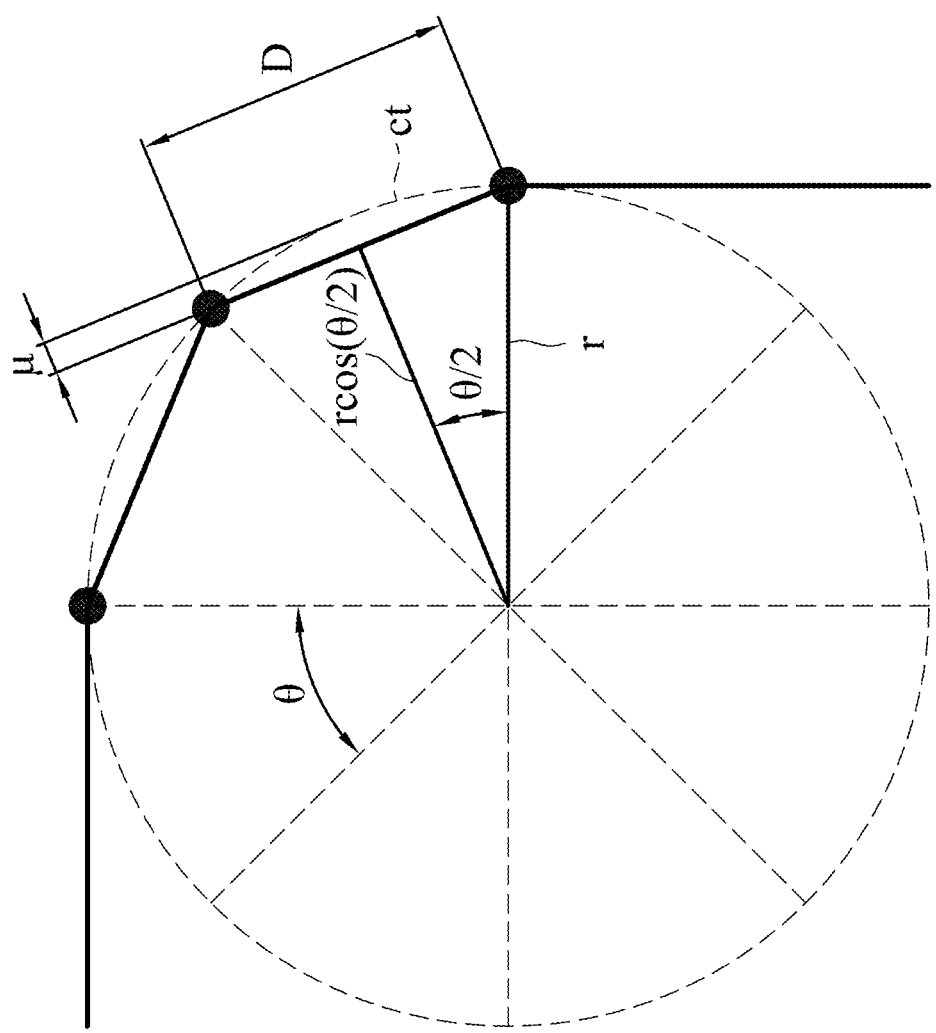
FIG. 3 shows a schematic view explaining a definition of a manufacturing variance and a definition of a pitch between node centers, in accordance with some embodiments.

Therefore, as shown in FIG. 3, the curved path ct has a rotation radius r. By applying an infinite number of nodes on the curved path ct, a manufacturing variance for applying the sealant would be approximately zero. On the other hand, by applying a finite number of nodes on the curved path ct, a manufacturing variance for applying the sealant would be approximately $\mu$. Then, according to the trigonometry, we can get the following equation:

$$0 < r - r\cos(\theta/2) \leq \mu$$

Then, we define the shortest distance between two neighboring nodes is a distance D. If the manufacturing variance is zero, the distance D would be zero. If the manufacturing variance is $\mu$, according to the trigonometry, the distance D can be calculated from the following equations:

$$D = 2r\sin\left(\frac{\theta}{2}\right) = 2r \times \sqrt{\frac{2\mu}{r} - \left(\frac{\mu}{r}\right)^2}$$
$$= 2\sqrt{\mu(2r - \mu)}$$

According to the above result, we can conclude that, under a fixed manufacturing variance, the distance D is greater when the rotation radius r is greater. In other words, the distance D may be approximately proportional to the square root of the rotation radius r:

$$D \propto \sqrt{r}$$

Based on the above relationship, during the manufacturing of the same display panel, if the manufacturing variance is fixed, a larger rotation radius r of the curved path makes a larger distance D.

In one embodiment, a manufacturing variance $\mu$ is given, the distance D may satisfy the following equation:

$$0 < D \leq 2\sqrt{\mu(2r - \mu)}$$

In one embodiment, a minimum manufacturing variance $\mu_1$ is given and a maximum manufacturing variance $\mu_2$ is given, the distance D may satisfy the following equation:

$$2\sqrt{\mu_1(2r - \mu_1)} < D \leq 2\sqrt{\mu_2(2r - \mu_2)}$$

However, the manufacturing variance may be varied in different regions of the non-display area of the display panel. Therefore, under a variable manufacturing variance, a larger rotation radius r does not necessarily result in a larger distance D.

In some embodiments, to avoid the display area AA being affected by the curved segment of the sealant, or to avoid the sealant leaking outside of the first substrate 10, the manufacturing variance for applying the curved segment of the sealant 40 is determined based on the distance d between the display area AA and the edge of the substrate. For example, as shown in FIG. 2, the lateral edge 111 of the display panel 1 is spaced apart from the edge 120 of the display area AA by a distance $d_1$, and the lateral edge 115 of the display panel 1 is spaced apart from the edge 120 of the display area AA by a distance $d_2$, wherein the distance $d_2$ is equals to the distance $d_1$. Therefore, the manufacturing variance for applying the curved segment 42 of the sealant 40 is substantially the same as the manufacturing variance for applying the curved segment 44 of the sealant 40. In some embodiments, a sealant comprises multiple curved segments and the one curved segment having the biggest rotation radius r may satisfy the above equation.

In some embodiments, the manufacturing variance for applying the curved segment of the sealant equals to the distance d between the lateral edge of the substrate and the edge of the display area AA. Or, the value of the manufacturing variance may be adjusted according to different requirements of the display panel. For example, the manufacturing variance may be 10 μm, 50 μm, 100 μm, 150 μm, or 200 μm, but the disclosure should not be limited thereto. According to the preset manufacturing variance, the operator determines the number of node for applying the sealant on the corresponding curved path. In cases where the distance d between the lateral edge of the substrate and the edge of the display area AA is selected as the manufacturing variance, the distance D between two neighboring nodes may satisfy the following equation:

$$0 < D \leq 2\sqrt{d(2r - d)}$$

In one embodiment, a minimum manufacturing variance is 10 μm and a maximum manufacturing variance is 200 μm. Then, the distance D satisfies the following range:

$$2\sqrt{10(2r-10)} \leq D \leq 2\sqrt{200(2r-200)}$$

wherein r and D in unit of micrometer

Figure 4:
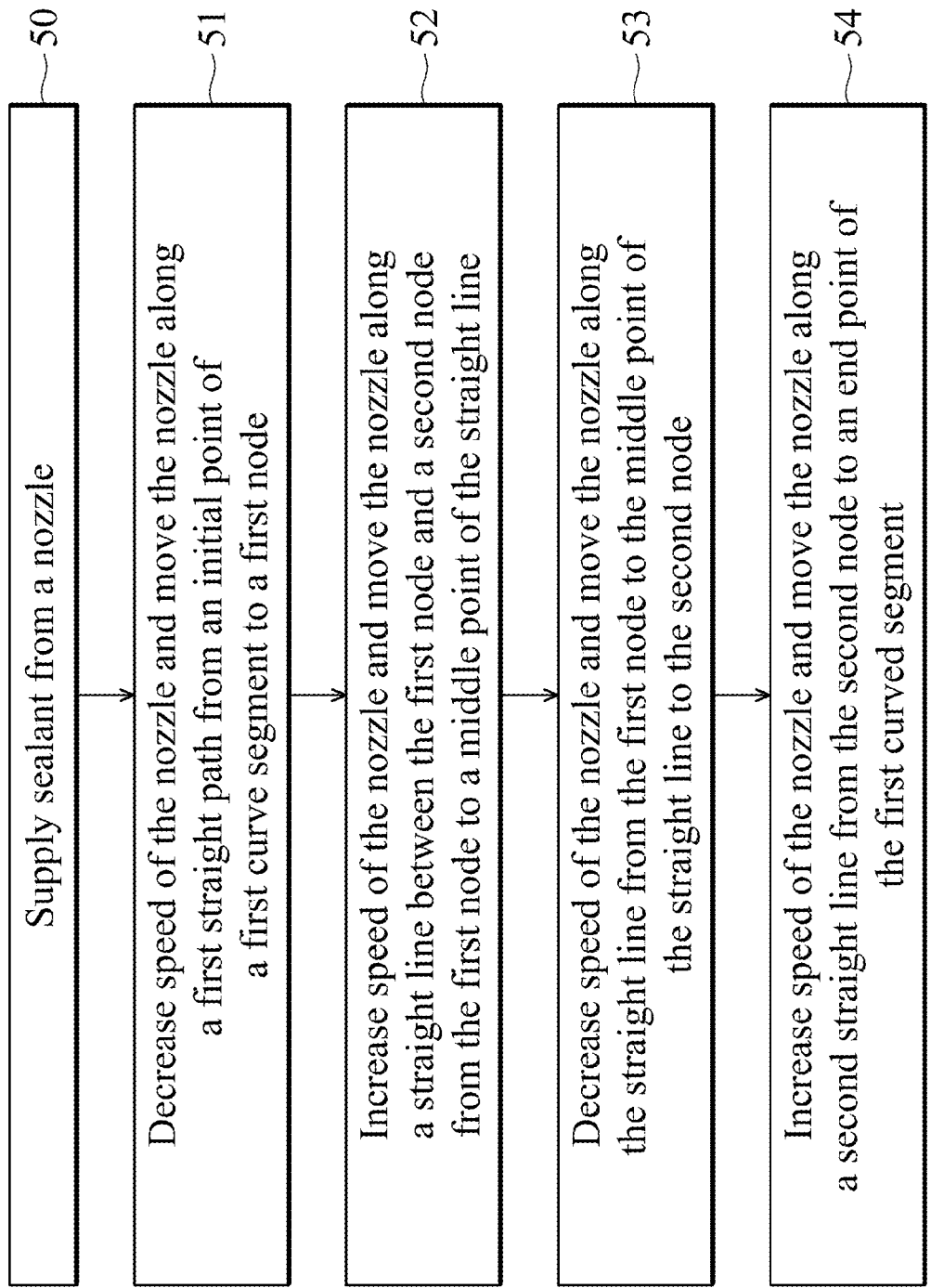
FIG. 4 shows a flow chart of a method for applying a curved segment of a sealant, in accordance with some embodiments.

FIG. 4 is a flow chart illustrating a method 5 for applying the curved segment 42 of the sealant 40, in accordance with some embodiments. For illustration, the flow chart will be described along with the schematic views shown in FIG. 5. Some of the steps described in FIG. 4 can be replaced or eliminated for different embodiments.

Figure 5:
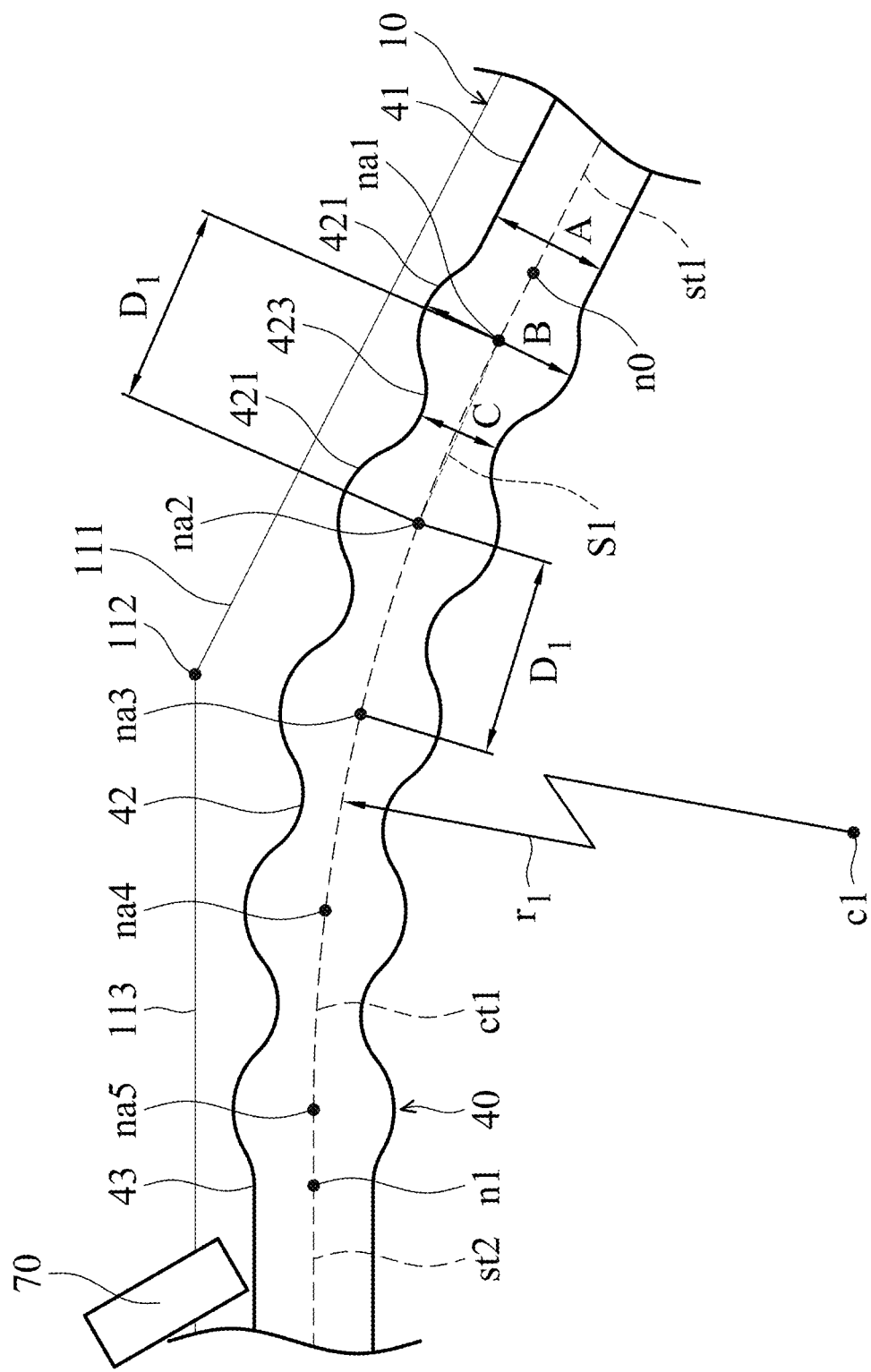
FIG. 5 shows an enlarged view of a region in FIG. 2 near an intersection point 112, in accordance with some embodiments.

Method 5 for applying the curved segment 42 of the sealant 40 is described below:

The method 5 begins with step 50, in which sealant material is applied by the nozzle 70. In step 51 the speed of the nozzle 70 is decreased with a negative acceleration a1. In addition, as shown in FIG. 5, the nozzle 70 is moved from an initial point n0 of the curved segment 42 to a node na1 at the first curved path ct1 which is immediately adjacent to the initial point n0. During this process, sealant material is continuously supplied from the nozzle 70 and is applied on the first substrate 10, and the speed of the nozzle 70 gradually decreases from a preset speed V0 at which the nozzle 70 is moved to apply the straight segment 41. As a result, the width of the sealant gradually increases to width B. In some embodiments, when the nozzle 70 reaches the node na1, the speed of the nozzle 70 is 0. In some embodiments, when the nozzle 70 reaches the node na1, the speed of the nozzle 70 is still greater than 0.

In some embodiments, before applying the curved segment 42, the nozzle 70 is moved along the first straight path st1 at the preset speed V0, and the sealant material is supplied from the nozzle 70 at a fixed flow rate to form the straight segment 41 of the sealant 40 on the first substrate 10, wherein the width of the straight segment 41 of the sealant 40 is A. In some embodiments, the nozzle 70 is moved from the initial point n0 of the curved segment 42 to the node na1 along the first straight path st1.

In step 52, the speed of the nozzle 70 is increased with a positive acceleration a2. In addition, as shown in FIG. 5, the nozzle 70 is moved from the node na1 to a middle point of a straight line S1 between the node na1 and the node na2. During this process, sealant material is continuously supplied from the nozzle 70 and is applied on the first substrate 10, and the speed of the nozzle 70 gradually increases. As a result, the width of the sealant gradually decreases to width C.

In some embodiments, the nozzle 70 reaches the middle point of the straight line S1 at speed V1, and the speed V1 is greater than the speed V0 at which the nozzle 70 is moved to apply the straight segment 41. Alternatively, the nozzle 70 reaches the middle point of the straight line S1 at speed V1, and the speed V1 is less than the speed V0 at which the nozzle 70 is moved to apply the straight segment 41. Alternatively, the nozzle 70 reaches the middle point of the straight line S1 at speed V1, and the speed V1 equals to the speed V0 at which the nozzle 70 is moved to apply the straight segment 41. In some embodiments, the step 52 terminates as the nozzle 70 reaches a position behind or ahead of the middle point of the straight line S1.

In step 53, the speed of the nozzle 70 is decreased with a negative acceleration a3. In addition, as shown in FIG. 5, the nozzle 70 is moved from the middle point of the straight line S1 to the node na2 along the straight line S1. During this process, sealant material is continuously supplied from the nozzle 70 and is applied on the first substrate 10, and the speed of the nozzle 70 gradually decreases. As a result, the width of the sealant gradually increases again.

In some embodiments, the nozzle 70 is moved at the acceleration a1 and the acceleration a3 for the same time period, and the acceleration a1 equals to the acceleration a3. Therefore, the sealant at the node na2 has the same width B as the sealant at the node na1; however, the disclosure should not be limited thereto. In some other embodiments, the acceleration a1 is different from the acceleration a3, and thus the width of the sealant 40 at the node na1 is different from the width of sealant at the node na2.

Afterwards, the sealant material is applied on the first substrate 10 along a straight line between the nodes na2 and na3, and along a straight line between the nodes na3 and na4, and along a straight line between the nodes na4 and na5 by the method similar to the steps 52 and 53.

In step 54, the speed of the nozzle 70 is increased with a positive acceleration a2. In addition, as shown in FIG. 5, the nozzle 70 is moved from the node na5 to an end point n1 of the curved segment 42 along the second straight path st2. During this process, sealant material is continuously supplied from the nozzle 70 and is applied on the first substrate 10, and the speed of the nozzle 70 gradually increases. As a result, the width of the sealant gradually decreases. In some embodiments, the step 54 is not stopped until the speed of the nozzle 70 is increased to the preset speed V0 at which the nozzle 70 is moved to apply the straight segment 41.

In the above-mentioned embodiments, the nodes na1-na5 are separated by the same distance $D_1$, and the distance D between the two neighboring node centers may satisfy the following equation:

$$0 < D_1 \leq 2\sqrt{\mu_1(2r_1 - \mu_1)}$$

where $r_1$ is the rotation radius of the first curved path ct1, $\mu_1$ is the manufacturing variance utilized for applying the curved segment 42. In one embodiment, If the manufacturing variance $\mu_1$ is substituted with the distance $d_1$ between the lateral edge 111 of the substrate and the edge of the display area AA, the distance $D_1$ may satisfy the following equation:

$$0 < D_1 \leq 2\sqrt{d_1(2r_1 - d_1)}$$

In one embodiment, If the manufacturing variance $\mu_1$ is substituted with the distance 200 μm, the distance $D_1$ may satisfy the following equation:

$$0 < D_1 \leq 2\sqrt{200(2r_1 - 200)}$$

wherein $r_1$ and $D_1$ in unit of micrometer

Further, If a minimum manufacturing variance is substituted with the distance 10 μm, the distance $D_1$ may satisfy the following equation:

$$2\sqrt{10(2r_1 - 10)} < D_1 \leq 2\sqrt{200(2r_1 - 200)}$$

wherein $r_1$ and $D_1$ in unit of micrometer

In some embodiments, the curved segment 42 defines one sealant node 421 at each of the nodes na1-na5. Each of the sealant nodes 421 is located within a range of a circle-like shape and the width of each sealant node 421 changes in a narrow-wide-narrow manner. For example, as shown in FIG. 5, the width of the sealant node 421 changes in a A-B-C manner, wherein the width B is greater than the width A as well as the width C. The centers of the sealant nodes 421 are respectively located at the nodes na1-na5, and the radius of the sealant node 421 is smaller than 0.5 times of the distance $D_1$. In addition, the curved segment 42 defines a connection portion 423 between the two neighboring nodes 421. The sealant node 421 has a larger width of B and the connection portion 423 has a smaller width of C. The width B is greater than the width A of the straight segment 41, and the width A of the straight segment 41 is greater than or equals to the width C of the connection portion 423. In some embodiments, the widths A, B, and C are respectively measured in a direction perpendicular to the first curved path ct1.

Figure 6:
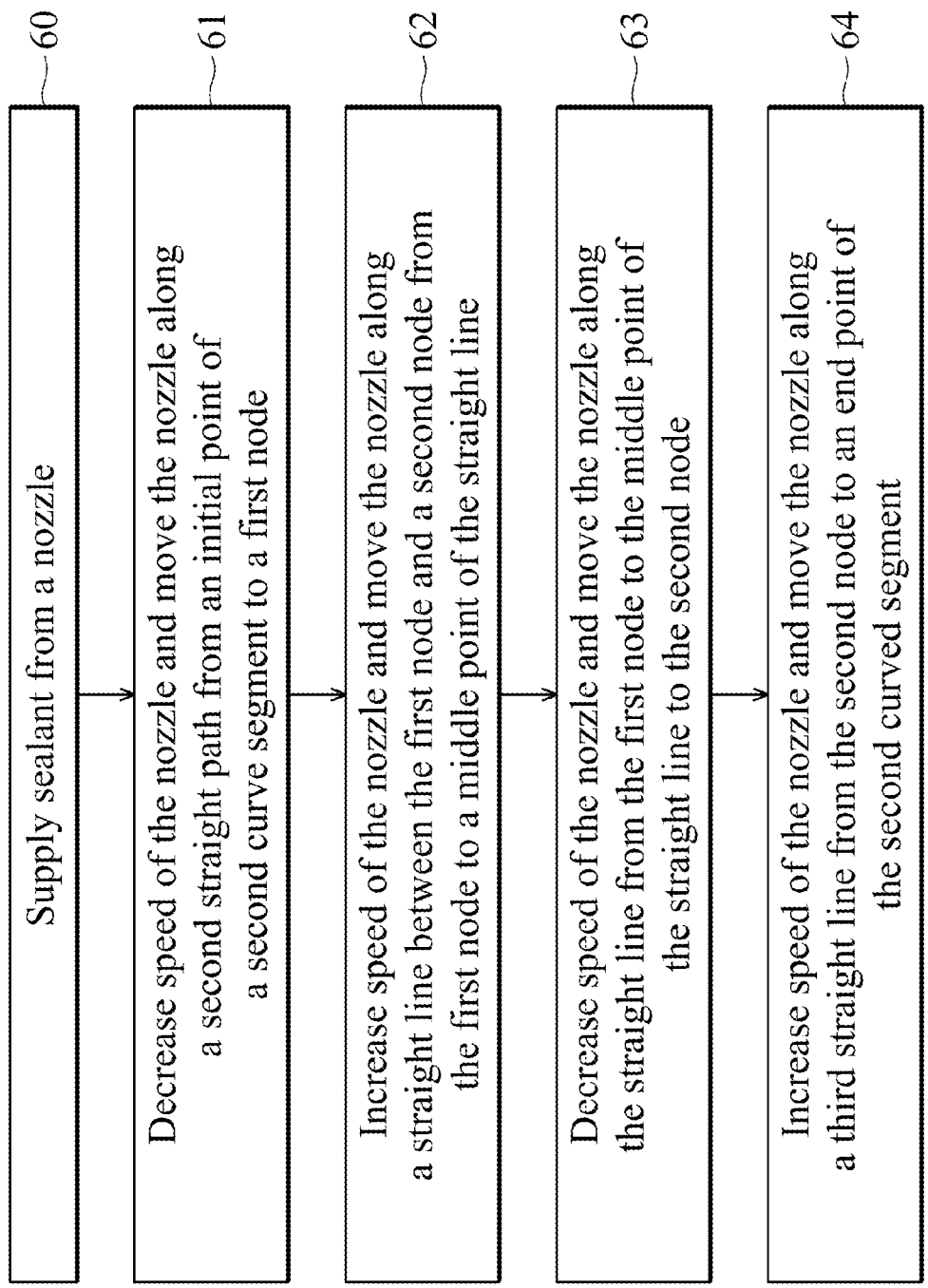
FIG. 6 shows a flow chart of a method for applying a curved segment of a sealant, in accordance with some embodiments.

FIG. 6 is a flow chart illustrating a method 6 for applying the curved segment 44 of the sealant 40, in accordance with some embodiments. For illustration, the flow chart will be described along with the schematic views shown in FIG. 7. Some of the steps described in FIG. 6 can be replaced or eliminated for different embodiments.

Figure 7:
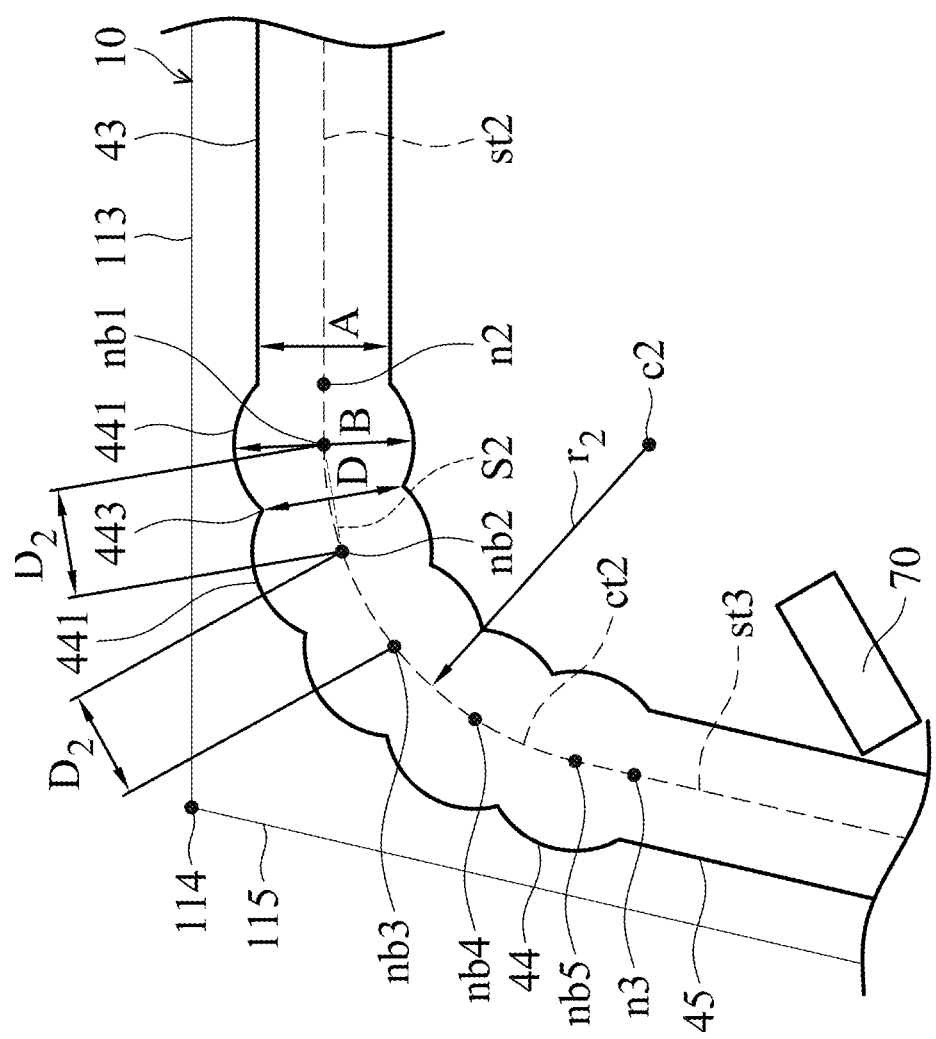
FIG. 7 shows an enlarged view of a region in FIG. 2 near an intersection point 114, in accordance with some embodiments.

Method 6 for applying the curved segment 44 of the sealant 40 is described below:

The method 6 begins with step 60, in which sealant material is applied by the nozzle 70. In step 61, the speed of the nozzle 70 is decreased with a negative acceleration a1. In addition, as shown in FIG. 7, the nozzle 70 is moved from an initial point n2 of the curved segment 44 to a node nb1 at the second curved path ct2 which is immediately adjacent to the initial point n2. During this process, sealant material is continuously supplied from the nozzle 70 and is applied on the first substrate 10, and the speed of the nozzle 70 gradually decreases from a preset speed V0 at which the nozzle 70 is moved to apply the straight segment 43. As a result, the width of the sealant gradually increases to width B. In some embodiments, when the nozzle 70 reaches the node nb1, the speed of the nozzle 70 is 0. In some embodiments, when the nozzle 70 reaches the node nb1, the speed of the nozzle 70 is still greater than 0.

In some embodiments, before applying the curved segment 44, the nozzle 70 is moved along the second straight path st2 at the preset speed V0, and the sealant material is supplied from the nozzle 70 in a fixed flow rate to form the straight segment 43 of the sealant 40 on the first substrate 10, wherein the width of the straight segment 43 of the sealant 40 is A. In some embodiments, the nozzle 70 is moved from the initial point n2 of the curved segment 44 to the node nb1 along the second straight path st2.

In step 62, the speed of the nozzle 70 is increased with a positive acceleration a2. In addition, as shown in FIG. 7, the nozzle 70 is moved from the node nb1 to a middle point of a straight line S2 between the node nb1 and the node nb2. During this process, sealant material is continuously supplied from the nozzle 70 and is applied on the first substrate 10, and the speed of the nozzle 70 gradually increases. As a result, the width of the sealant gradually decreases to width D.

In some embodiments, the nozzle 70 reaches the middle point of the straight line S2 at speed V2, and the speed V2 is greater than the speed V0 at which the nozzle 70 is moved to apply the straight segment 43. Alternatively, the nozzle 70 reaches the middle point of the straight line S2 at speed V2, and the speed V2 equals to the speed V0 at which the nozzle 70 is moved to apply the straight segment 43. Alternatively, the nozzle 70 reaches the middle point of the straight line S2 at speed V2, and the speed V2 is less than the speed V0 at which the nozzle 70 is moved to apply the straight segment 41. In some embodiments, the step 62 terminates as the nozzle 70 reaches a position behind or ahead of the middle point of the straight line S2.

In step 63, the speed of the nozzle 70 is decreased with a negative acceleration a3. In addition, as shown in FIG. 7, the nozzle 70 is moved from the middle point of the straight line S2 to the node nb2 along the straight line S2. During this process, sealant material is continuously supplied from the nozzle 70 and is applied on the first substrate 10, and the speed of the nozzle 70 gradually decreases. As a result, the width of the sealant gradually increases again.

In some embodiments, the nozzle 70 is moved at the acceleration a1 and the acceleration a3 for the same time period, and the acceleration a1 equals to the acceleration a3. Therefore, the sealant at the node nb2 has the same width B as the sealant at the node nb1; however, the disclosure should not be limited thereto. In some other embodiments, the acceleration a1 is different from the acceleration a3, and thus the width of sealant at the node nb1 is different from the width of the sealant at the node nb2.

Afterwards, the sealant material is applied on the first substrate 10 along a straight line between the nodes nb2 and nb3, and along a straight line between the nodes nb3 and nb4, and along a straight line between the nodes nb4 and nb5 by the method similar to the steps 62 and 63.

In step 64, the speed of the nozzle 70 is increased with a positive acceleration a2. In addition, as shown in FIG. 7, the nozzle 70 is moved from the node nb5 to an end point n3 of the curved segment 44 along the third straight path st3. During this process, sealant material is continuously supplied from the nozzle 70 and is applied on the first substrate 10, and the speed of the nozzle 70 gradually increases. As a result, the width of the sealant gradually decreases. In some embodiments, the step 64 is not stopped until the speed of the nozzle 70 is increased to the preset speed V0 at which the nozzle 70 is moved to apply the straight segment 43.

In the above-mentioned embodiments, the nodes nb1-nb5 are separated by the same distance $D_2$, and the distance $D_2$ between the two neighboring node may satisfy the following equation:

$$0<D_1\leq 2\sqrt{\mu_2(2r_2-\mu_2)}$$

where $r_2$ is the rotation radius of the second curved path ct2, $\mu_2$ is the manufacturing variance utilized for applying the curved segment 44. If the manufacturing variance $\mu_2$ is substituted with the distance $d_2$ between the lateral edge 115 of the substrate and the edge of the display area AA, the distance $D_2$ may satisfy the following equation:

$$0<D_1\leq 2\sqrt{d_2(2r_2-d_2)}$$

In one embodiment, If the manufacturing variance $\mu_2$ is substituted with the distance 200 μm, the distance $D_2$ may satisfy the following equation:

$$0<D_2\leq 2\sqrt{200(2r_2-200)}$$

wherein $r_2$ and $D_2$ in unit of micrometer

In some embodiments, the curved segment 44 defines one sealant node 441 at each of the nodes nb1-nb5. Each of the sealant nodes 441 is located within a range of a circle-like shape and the width of each sealant node 441 changes in a narrow-wide-narrow manner. The centers of the sealant nodes 441 are respectively located at the nodes na1-na5, and the radius of the sealant nodes 441 is smaller than 0.5 times of the distance $D_2$. In addition, the curved segment 44 defines an overlapping portion 443 at which the two neighboring sealant nodes 441 overlap. The sealant node 441 has a larger width B and the overlapping portion 443 has a smaller width D. The width B is greater than the width A of the straight segment 41. The width A of the straight segment 41 is smaller than the width D. In some embodiments, the width A of the straight segment 41 is equal to or larger than the width D. In some embodiments, the widths A, B, and D are measured in a direction perpendicular to the second curved path ct2.

Referring to FIG. 2 and with reference to FIGS. 4 and 6, in some embodiments, the manufacturing variances for applying the first curved segment 42 and the second curved segment 44 are assumed to be the same value. Therefore, according to the following equation:

$$D \propto \sqrt{r}$$

The rotation radius $r_2$ of the second curved path ct2 is smaller than the rotation radius $r_1$ of the first curved path ct1, so the distance $D_2$ between two neighboring sealant nodes 441 is smaller than the distance $D_1$ between two neighboring sealant nodes 421. Namely, under the same manufacturing variance, the rotation radius $r_1$ and the rotation radius $r_2$ may satisfy the relation of $0 < r_2/r_1 < 1$, and the distance $D_1$ and the distance $D_2$ may satisfy the relation of $0 < D_2/D_1 < 1$.

Figure 8:
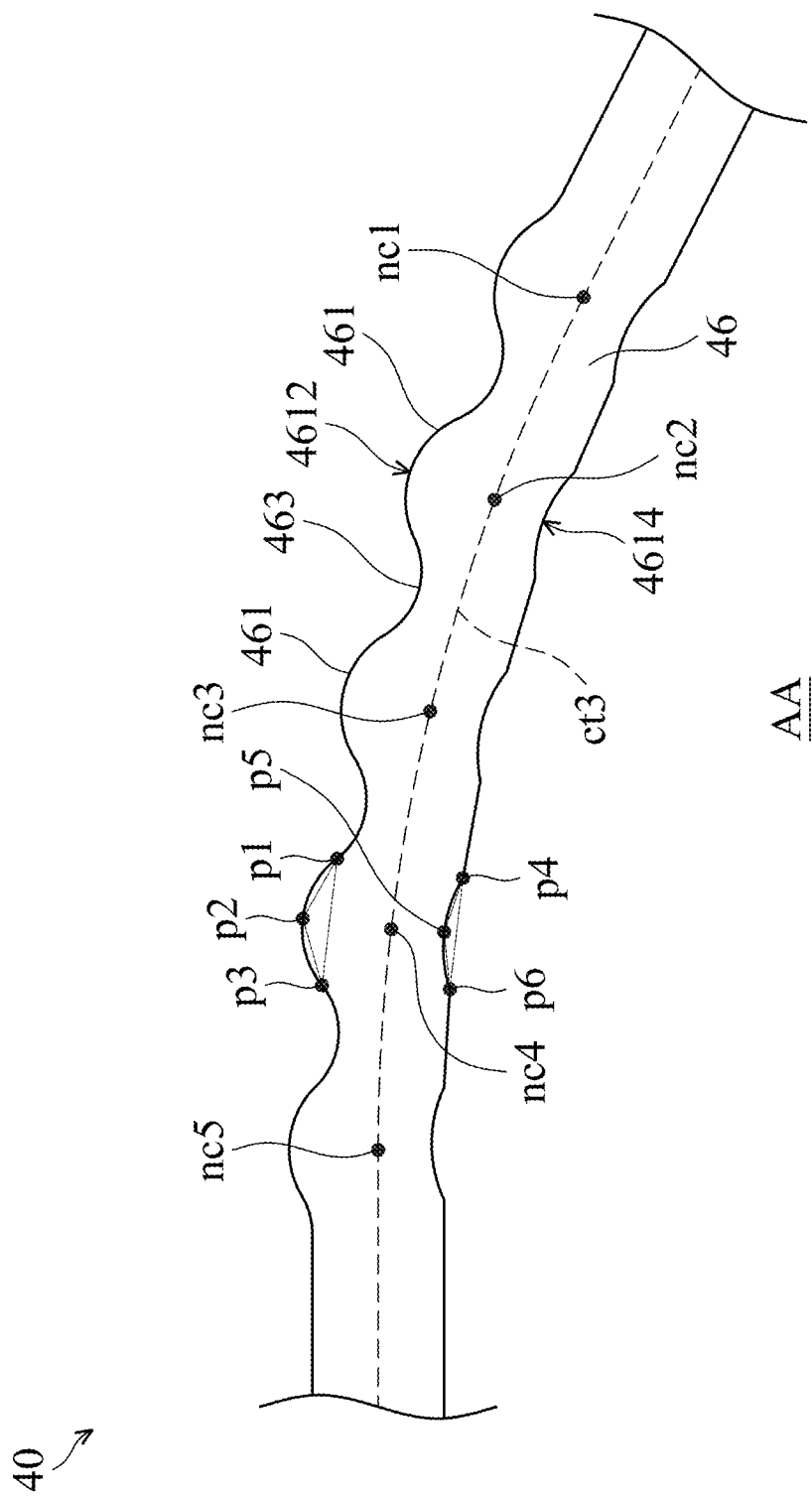
FIG. 8 shows a schematic view of a sealant, in accordance with some embodiments.

FIG. 8 shows a schematic view of the sealant 40, in accordance with some embodiments. In some embodiments, the sealant 40 further includes a curved segment 46. The curved segment 46 includes a number of sealant nodes 461, and the sealant nodes 461 have their node nc1-nc5 arranged on a third curved path ct3. In addition, the curved segment 46 includes a number of connection portions 463 positioned between the two neighboring sealant nodes 461.

In some embodiments, the maximum distance between the outer edge 4612 of the sealant node 461 (i.e., an edge of the sealant node 461 which is away from the display area AA) and the third curved path ct3, is greater than the maximum distance between the inner edge 4614 of the sealant node 461 (i.e., an edge of the sealant node 461 which is close to the display area AA) and the third curved path ct3.

Specifically, as shown in FIG. 8, the outer edge 4612 the sealant node 461 includes a first end point p1, a second end point p2, and a third end point p3, wherein the first and the second end points p1 and p2 are separated by a predetermined distance, and the second and the third end points p2 and p3 are separated by the same predetermined distance. Moreover, the inner edge 4614 of the sealant node 461 includes a fourth end point p4, a fifth end point p5, and a sixth end point p6, wherein the fourth and the fifth end points p4 and p5 are separated by the predetermined distance, and the fifth and the sixth end points p5 and p6 are separated by the predetermined distance. In the embodiment, an area enclosed by the first end point p1, the second end point p2, and the third end point p3 is greater than an area enclosed by the fourth point p4, the fifth point p5, and the sixth point p6. In more detail, an area enclosed by connection lines between an arbitrary two of the first point p1, the second point p2, and the third point p3, is greater than an area enclosed by connection lines between an arbitrary two of the fourth point p4, the fifth point p5, and the sixth point p6.

In some embodiments, the inner edge 4614 of the node 461 is closer to the third curved path ct3 than the neighboring connection portion 463. Namely, the distance between the inner edge 4614 of the node 461 and the third curved path ct3 is smaller than the distance between the connection portion 463 and the third curved path ct3.

In the embodiment shown in FIG. 8, due to the feature that the inner edge 4614 of the curved segment 46 is closer to the third curved path ct3 than the outer edge 4612, the over-flow of the sealant 46 in the display area AA will not occur. As a result, the adverse effect on the display panel 1 resulting from the sealant is avoided.

Figure 9:
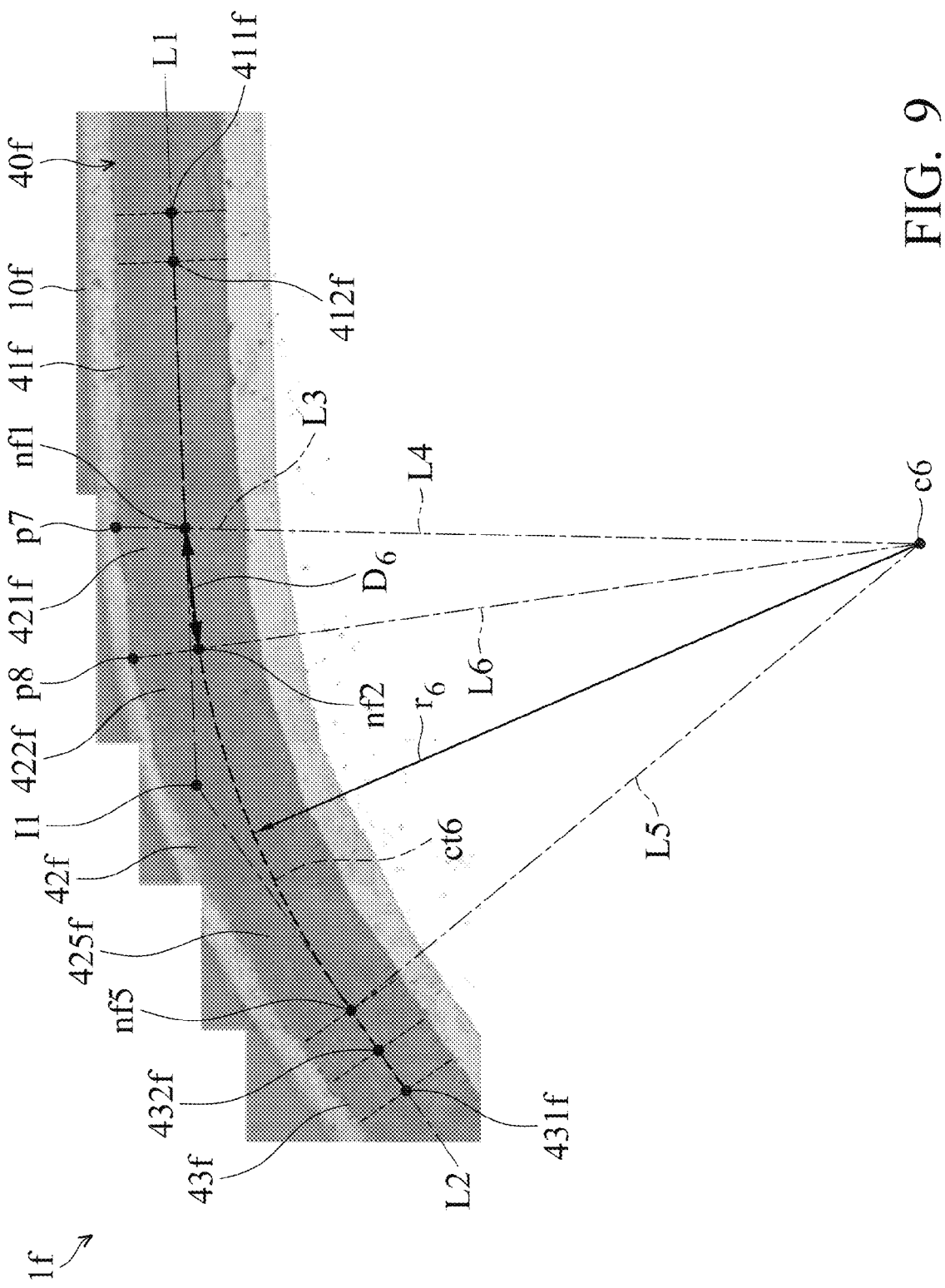
FIG. 9 shows an image of a display panel observed with a microscope, in accordance with some embodiments.

FIG. 9 shows an image of a display panel if observed with an optical microscope, in accordance with some embodiments. The display panel if includes a first substrate 10f and a sealant 40f. A curved segment 42f of the sealant 40f is located between a straight segment 41f and a straight segment 43f.

A method for determining nodes along a curved path ct6 of the sealant 40f is described below. But the method is not limited thereto.

Firstly, create a connection line L1 by connecting any two width centers 411f and 412f of the straight segment 41f. Afterwards, create a connection line L2 by connecting any two width centers 431f and 432f of the straight segment 43f. Afterwards, find a point I1 at the intersection of the connection line L1 and the connection line L2. Note that the width center of the straight segment is positioned at a half of the width of the straight segment.

Afterwards, find a sealant node 421f at the curved segment 42f. The sealant node 421f is a structure positioned immediately adjacent to the straight segment 41f along the application direction of the sealant 40 and has a width arranged in a narrow-wide-narrow manner. Afterwards, create a connection line L3 passing through an outer convex point p7 and perpendicular to the connection line L1, wherein the outer convex point p7 of the sealant node 421f is a point at the outer edge of the sealant node 421f which is farthest from connection line L1. Afterwards, find a node nf1 at the intersection of the connection line L3 and the connection line L1. The node nf1 is one of the nodes along the curved path ct6 and corresponds to the center of the sealant node 421f. Afterwards, make a circle with a center at the point I1 and with a radius which is equal to the distance between the point I1 and the node nf1, and find another node nf5 at the intersection of the circle and the connection line L2. The node nf5 is one of the nodes along the curved path ct6 and corresponds to the center of the sealant node 425f.

A method for determining the rotation center c6 of the curved path ct6 on which the node nf1 and the node nf5 are located is described below. But the method is not limited thereto. Firstly, create a connection line L4 passing through the node nf1 and perpendicular to the connection line L1. Afterwards, create a connection line L5 passing through the node nf5 and perpendicular to the connection line L2. Afterwards, find a rotation center c6 of the curved path ct6 at the intersection of the connection line L4 and the connection line L5. The distance $r_6$ between the rotation center c6 and the node nf1 is equals to the distance $r_6$ between the rotation center c6 and the node nf5, and the distance $r_6$ is defined as the rotation radius of the curved path ct6, as well as the rotation radius of the curved segment 42f.

A method for determining the distance $D_6$ between the two neighboring nodes nf1 and nf2 is described below. But the method is not limited thereto. Firstly, find a sealant node 422f at the curved segment 42f. The sealant node 422f is a structure positioned immediately adjacent to the sealant node 421f along the application direction of the sealant 40 and has a width arranged in a narrow-wide-narrow manner. Afterwards, create a connection line L6 between an outer convex point p8 of the sealant node 422f and the rotation center c6. The outer convex point p8 is located at the intersection of the outer edge of the sealant node 422f and a circle with a center at the rotation center c6. In other words, the outer convex point p8 is a point of the outer edge of the sealant node 422f which is tangential to the circle.

Afterwards, make a circle with a center at the rotation center c6 and with a radius which is equal to the rotation radius $r_6$ so as to determine the curved path ct6. Afterwards, find a node nf2 at the intersection of the connection line L6 and the curved path ct6. The node nf2 is corresponding to the center of the sealant node 422f. The distance $D_6$ is equal to the linear distance between the node nf1 and the node nf2. And the distance $D_6$ is equal to the linear distance between the sealant node 421f and the sealant node 422f. However, the method for determining the node nf2 should not be limited to the above-mentioned embodiment. In some embodiments, the node nf2 is a geometrical center of the sealant node 422f.

In the embodiment shown in FIG. 9, the distance d between the edge of the substrate 10f and an edge of the display area AA is equal to the shortest distance between an edge of the substrate 10f and an edge of the display area AA. The edge of the substrate 10f is bounded between an intersection of the connection line L4 and the edge of the substrate 10f and another intersection of the connection line L5 and the edge of the substrate 10f. But the present disclosure is not limit thereto.

Figure 10:
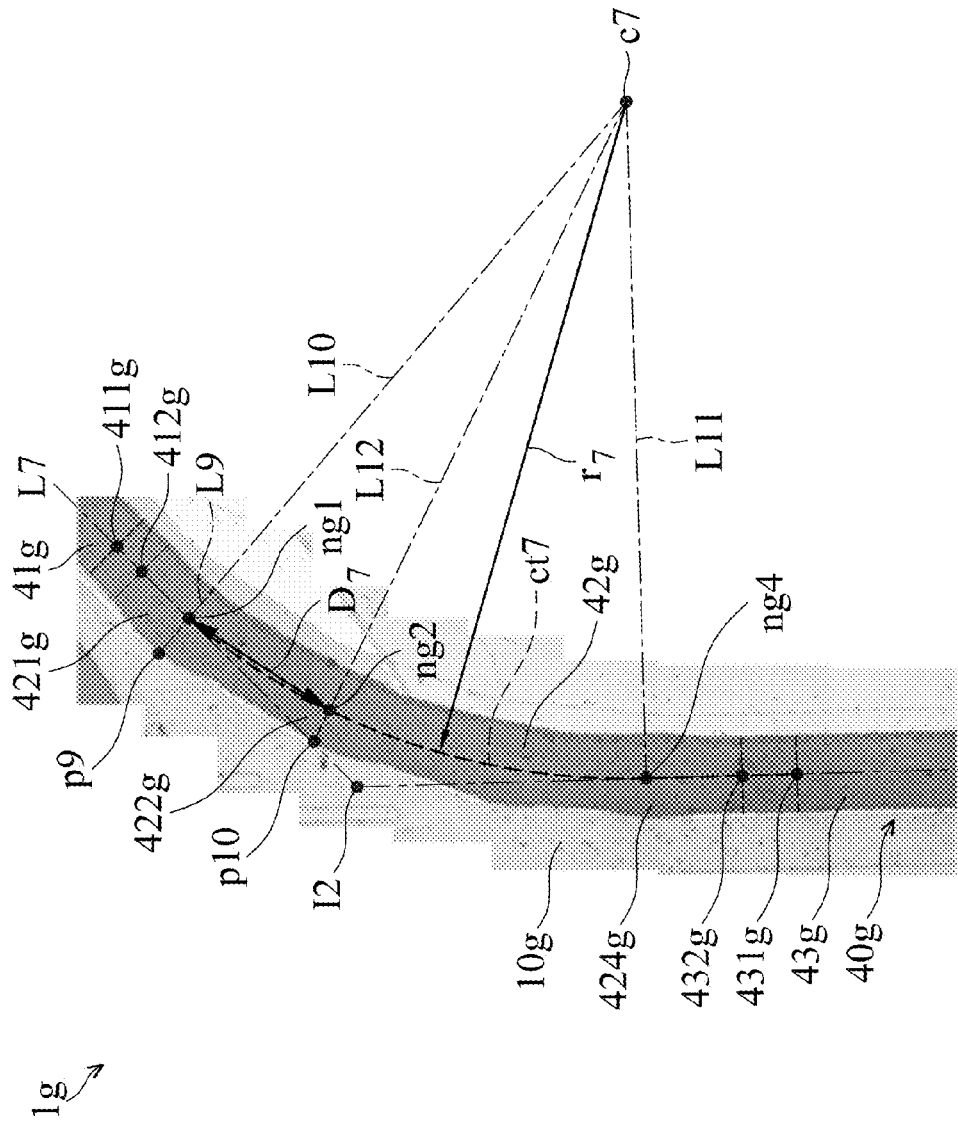
FIG. 10 shows an image of a display panel observed with a microscope, in accordance with some embodiments.

FIG. 10 shows an image of a display panel 1g observed with an optical microscope, in accordance with some embodiments. The display panel 1g includes a first substrate 10g and a sealant 40g. A curved segment 42g of the sealant 40g is located between a straight segment 41g and a straight segment 43g.

A method for determining nodes along the curved path ct7 of the sealant 40g is described below. But the method is not limited thereto.

Firstly, create a connection line L7 by connecting any two width centers 411g and 412g of the straight segment 41g. Afterwards, create a connection line L8 by connecting any two width centers 431g and 432g of the straight segment 43g. Afterwards, find a point 12 at the intersection of the connection line L7 and the connection line L8. Note that the width center of the straight segment is positioned at a half of the width of the straight segment.

Afterwards, find a sealant node 421g at the curved segment 42g. The sealant node 421g is a structure positioned immediately adjacent to the straight segment 41g along the application direction of the sealant 40 and has a width arranged in a narrow-wide-narrow manner. Afterwards, create a connection line L9 passing through an outer convex point p9 and perpendicular to the connection line L7, wherein the outer convex point p9 of the sealant node 421g is a point at the outer edge of the sealant node 421g which is farthest from connection line L7. Afterwards, find a node ng1 at the intersection of the connection line L7 and the connection line L9. The node ng1 is one of the nodes along the curved path ct7 and corresponds to the center of the sealant node 421g. Afterwards, make a circle with a center at the point 12 and with a radius which is equal to the distance between the point 12 and the node ng1, and find another node ng4 at the intersection of the circle and the connection line L2. The node ng4 is one of the nodes along the curved path ct7 and corresponds to the center of the sealant node 424g.

A method for determining the rotation center c7 of the curved path ct7 on which the node ng1 and the node ng4 are located is described below. But the method is not limited thereto. Firstly, create a connection line L10 passing through the node ng1 and perpendicular to the connection line L7. Afterwards, create a connection line L11 passing through the node ng4 and perpendicular to the connection line L8. Afterwards, find a rotation center c7 of the curved path ct7 at the intersection of the connection line L10 and the connection line L11. The distance $r_7$ between the rotation center c7 and the node ng1 is equal to the distance $r_7$ between the rotation center c7 and the node ng4, and the distance $r_7$ is defined as the rotation radius of the curved path ct7, as well as the rotation radius of the curved segment 42g.

A method for determining the distance $D_7$ between the node ng1 and the node ng2 is described below. But the method is not limited thereto. Firstly, find a sealant node 422g next to the sealant node 421g. The sealant node 422g is a structure positioned immediately adjacent to the sealant node 421g along the application direction of the sealant 40 and has a width arranged in a narrow-wide-narrow manner. Afterwards, create a connection line L12 between an outer convex point p10 of the sealant node 422g and the rotation center c7. The outer convex point p10 is located at an intersection of the outer edge of the sealant node 422g and a circle with a center at the rotation center c7. In other words, the outer convex point p10 is a point of the outer edge of the sealant node 422f which is tangential to the circle.

Afterwards, make a circle with a center at the rotation center c7 and with a radius which is equal to the rotation radius $r_7$ so as to determine the curved path ct7. Afterwards, find a node ng2 at the intersection of the connection line L12 and the curved path ct7. The node ng2 is corresponding to the center of the sealant node 422g. The distance $D_7$ is equal to the linear distance between the node ng1 and the node ng2. And the distance $D_7$ is equal to the linear distance between the sealant node 421g and the sealant node 422g. However, a method for determining the node center ng2 should not be limited to the above-mentioned embodiment. In some embodiments, the node ng2 is a geometrical center of the sealant node 422g.

In the embodiment shown in FIG. 10, the distance d between the edge of the substrate 10g and an edge of the display area AA is equal to the shortest distance between an edge of the substrate 10g and an edge of the display area AA. The edge of the substrate 10g is bounded between an intersection of the connection line L10 and the edge of the substrate 10g and another intersection of the connection line L11 and the edge of the substrate 10g. But the present disclosure is not limit thereto.

Figure 11:
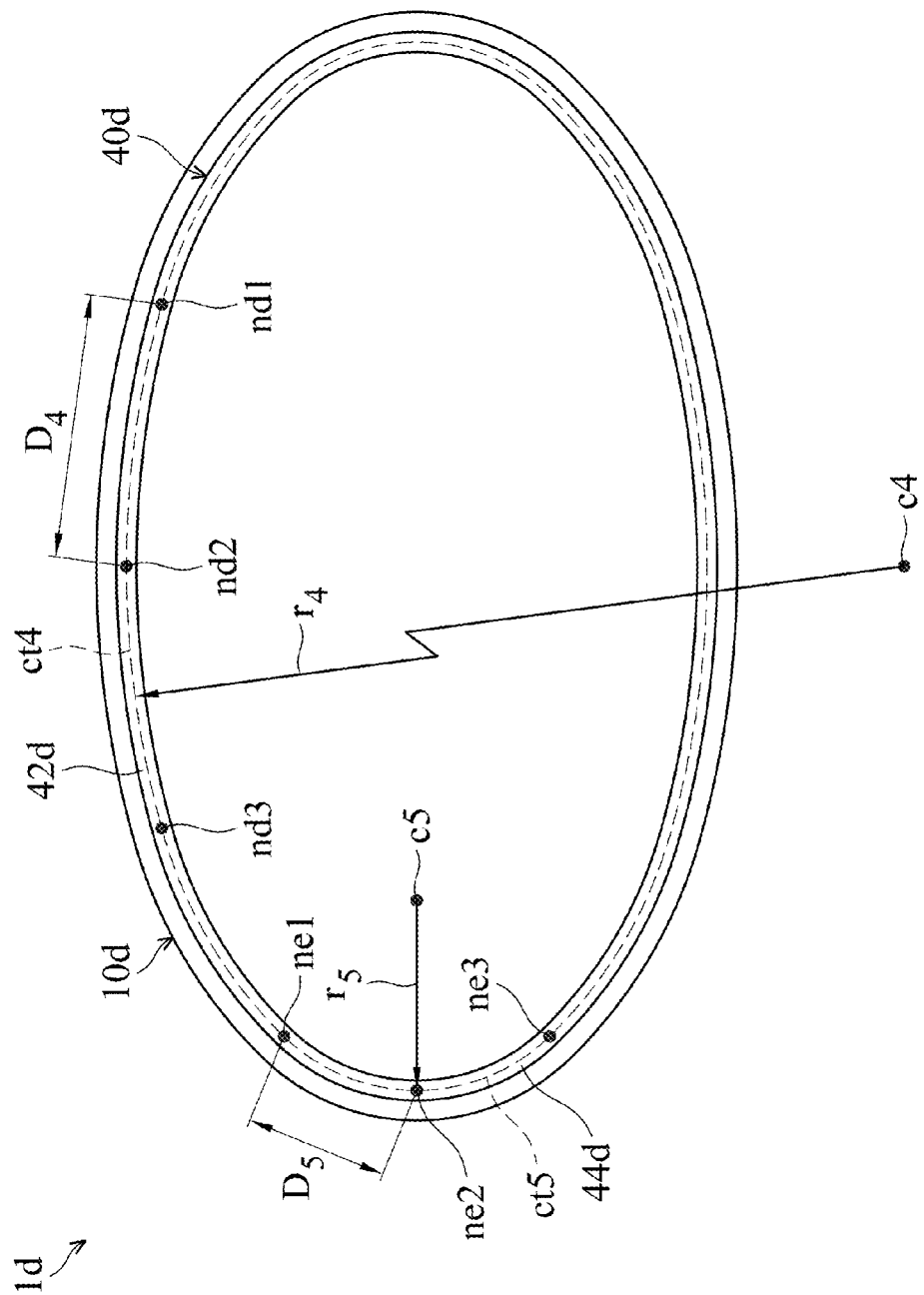
FIG. 11 shows a schematic view of a display panel, in accordance with some embodiments.

FIG. 11 shows a schematic view of a display panel 1d, in accordance with some embodiments. The display panel 1d includes a first substrate 10d and a sealant 40d. In the embodiment, the first substrate 10d has an elliptical shape, and the sealant 40d is applied on the substrate 10d along the edge of the first substrate 10d.

In some embodiments, in the vicinity of two ends of the minor axis of the first substrate 10d, the sealant 40d includes a first curved segment 42d. The first curved segment 42d is applied along the nodes nd1, nd2, and nd3 that are arranged on the first curved path ct4. The two neighboring nodes nd1, nd2, and nd3 are separated from one another by a distance $D_4$, and the first curved path ct4 has a rotation radius $r_4$ and a rotation center c4.

In the vicinity of two ends of the major axis of the first substrate 10d, the sealant 40d includes a second curved segment 44d. The second curved segment 44d is applied along the nodes ne1, ne2, and ne3 arranged on the second curved path ct5. The two neighboring node center ne1, ne2, and ne3 is separated from one the other by a distance $D_5$, and the second curved path ct5 has a rotation radius $r_5$ and a rotation center c5.

In some embodiments, under a condition that the manufacturing variance for applying the first curved segment 42d is the same as that for applying the second curved segment 44d. The rotation radius $r_5$ is smaller than the rotation radius $r_4$. Therefore, according to the following equation:

$$D \propto \sqrt{r}$$

The distance $D_5$ would be smaller than the distance $D_4$. Namely, the rotation radius $r_4$ and the rotation radius $r_5$ may satisfy the relation of $0<r_5/r_4<1$, and the distance $D_4$ and the distance $D_5$ may satisfy the relation of $0<D_5/D_4<1$.

Though the sealant nodes of the sealant 40d are not shown, the distance between two neighboring nodes is equal to the distance between the two neighboring sealant nodes. Similarly, the rotation radius of the curved path is equal to the rotation radius of the curved segment.

Figure 12:
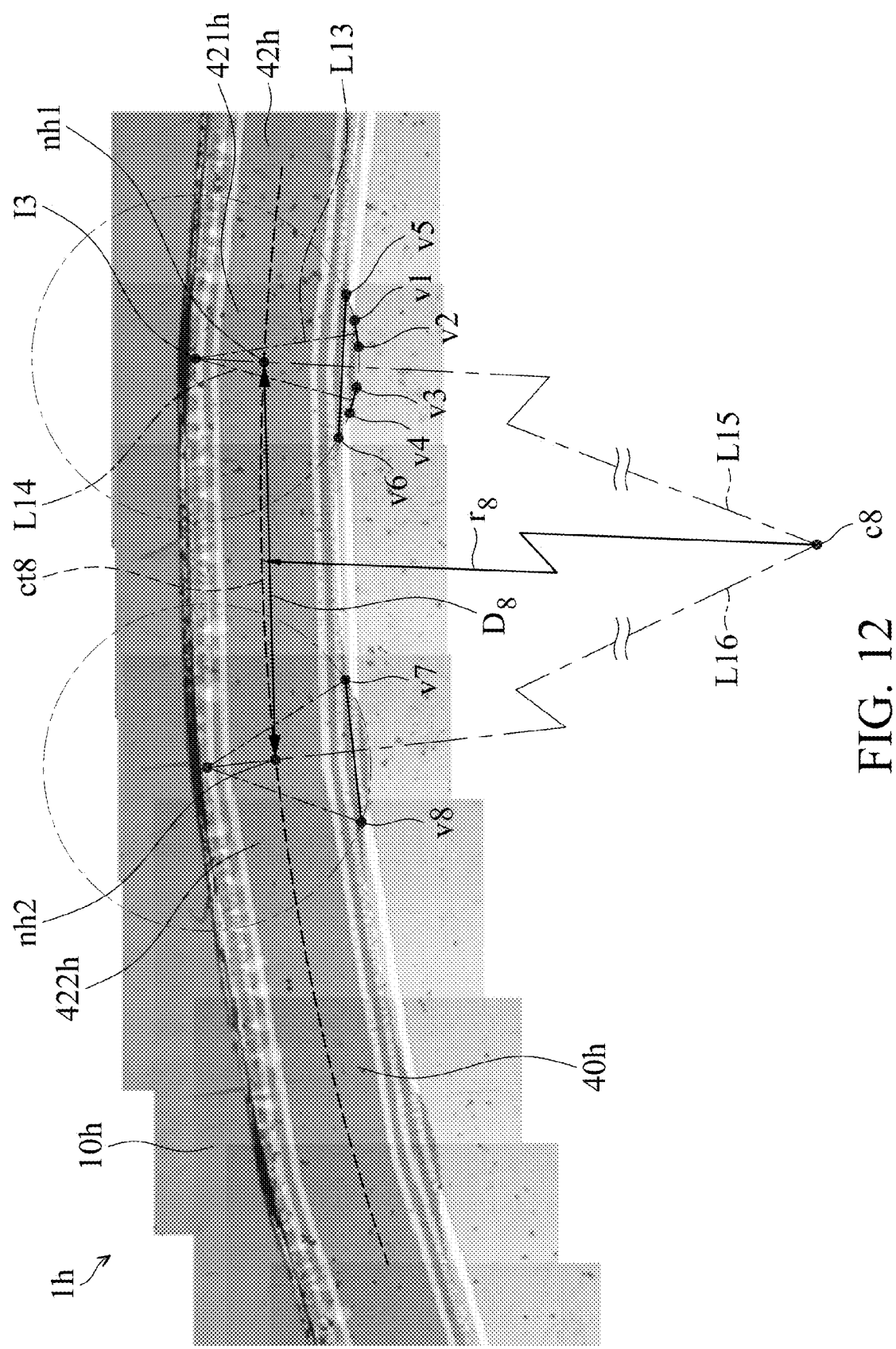
FIG. 12 shows an image of a display panel observed with a microscope, in accordance with some embodiments.

FIG. 12 shows an image of a display panel $1h$ observed with an optical microscope, in accordance with some embodiments. The display panel $1h$ includes a first substrate $10h$ and a sealant $40h$. The sealant $40h$ is applied along a curved path ct8 to form a curved segment $42h$.

A method for determining the rotation center c8 of the curved path ct8 on which the nodes nh1 and nh2 are located is described below. But the method is not limited thereto. Firstly, randomly select two points v1 and v2 at an inner edge of the sealant node $421h$ and create a central vertical line L13. Afterwards, randomly select two points v3 and v4 at the inner edge of the sealant node $421h$ and create a central vertical line L14. Find a point 13 at an intersection of the central vertical lines L13 and L14. Afterwards, make a circle with a center at the point 13 and make the circle approach the inner edge of the sealant node $421h$. The circumference of the circle and the inner edge of the sealant node $421h$ meet at two farthest points v5 and v6. A radius central vertical line L15 is obtained by connecting the two points v5 and v6. Afterwards, obtain another radius central vertical line L16 on another sealant node $422h$ using the same method. An intersection of the two radius central vertical lines L15 and L16 is the rotation center c8. The distance $r_8$ between the rotation center c8 and the curved path ct8 is defined as the rotation radius of the curved path ct8, as well as the rotation radius of the curved segment $42h$.

A method for determining the distance $D_8$ between the node nh1 and the node nh2 is described below. Firstly, find a sealant node $422h$ next to the sealant node $421h$. The node nh1 is located on the radius central vertical line L15 and located at a half of the width of the sealant node $421h$. The node nh1 is located on the radius central vertical line L16 and located at a half of the width of the sealant node $422h$. The distance $D_8$ is equal to the linear distance between the node nh1 and the node nh2. And the distance $D_8$ is equal to the linear distance between the sealant node $421h$ and the sealant node $422h$. However, the method for determining the node nh1 and the node nh2 should not be limited to the above-mentioned embodiment. In some embodiments, the node nh1 is a geometrical center of the sealant node $421h$, and the node nh2 is a geometrical center of the sealant node $422h$.

Embodiments for applying a sealant on a substrate are disclosed. By controlling the parameter (the number of nodes, and distance between nodes) for applying the sealant, the manufacturing time for applying the sealant is adjustable. Therefore, the display panel is produced sufficiently, and the throughput of the display panel is improved. In addition, since the manufacturing variance for applying the sealant is controlled within a particular range, the problem of the sealant being applied over the display area of the display panel is prevented.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A display panel, comprising:
a first substrate, having a display area;
a second substrate, arranged opposite to the first substrate;
a display layer, positioned between the first substrate and the second substrate; and
a sealant, positioned between the first substrate and the second substrate and neighboring the display layer, and the sealant comprising a curved segment, wherein the curved segment comprises two sealant nodes;
wherein the two sealant nodes are spaced apart by a first distance (D), and an edge of the display area is spaced apart from an edge of the first substrate by a second distance (d), and the curved segment has a rotation radius (r),
wherein the first distance (D), the second distance (d) and the rotation radius (r) satisfy the following equation:

$$0<D\leq 2\sqrt{d(2r-d)}.$$

2. The display panel as claimed in claim 1, wherein the sealant further comprises a straight segment connecting to the curved segment.

3. The display panel as claimed in claim 2, wherein a width of one of the two sealant nodes is greater than a width of the straight segment.

4. The display panel as claimed in claim 2, wherein the curved segment further comprises a connection portion connecting to the two sealant nodes, wherein a width of one of the two sealant nodes is greater than a width of the connection portion, and the width of the connection portion is less than or equal to the width of the straight segment.

5. The display panel as claimed in claim 2, wherein the curved segment further comprises an overlapping portion connecting to the two sealant nodes, wherein a width of one of the two sealant nodes is greater than a width of the overlapping portion, and the width of the overlapping portion is greater than the width of the straight segment.

6. The display panel as claimed in claim 1, wherein an outer edge of one of the two sealant nodes comprises a first end point, a second end point, and a third end point, wherein the first and the second end points are separated by a predetermined distance, and the second and the third end points are separated by the predetermined distance;
wherein an inner edge of one of the two sealant nodes comprises a fourth end point, a fifth end point, and a sixth end point, wherein the fourth and the fifth end points are separated by the predetermined distance, and the fifth and the sixth end points are separated by the predetermined distance;
wherein an area enclosed by the first point, the second point, and the third point is greater than an area enclosed by the fourth point, the fifth point, and the sixth point.

7. display panel, comprising:
a first substrate;
a second substrate, arranged opposite to the first substrate;
a display layer, positioned between the first substrate and the second substrate; and a sealant, positioned between the first substrate and the second substrate and neighboring the display layer, and the sealant comprising a curved segment, wherein the curved segment comprises two sealant nodes;

wherein the two sealant nodes are spaced apart by a first distance (D), and the curved segment has a rotation radius (r), wherein the first distance (D) and the rotation radius (r) satisfy the following equation:

$$0<D\leq 2\sqrt{200(2r-200)}$$

wherein r and D in unit of micrometer.

8. The display panel as claimed in claim 7, wherein the first distance (D) and the rotation radius (r) further satisfy the following equation:

$$2\sqrt{10(2r-10)}\leq D\leq 2\sqrt{200(2r-200)}$$

wherein r and D in unit of micrometer.

9. The display panel as claimed in claim 7, wherein the sealant further comprises a straight segment connecting to the curved segment.

10. The display panel as claimed in claim 9, wherein a width of one of the two sealant nodes is greater than a width of the straight segment.

11. The display panel as claimed in claim 9, wherein the curved segment further comprises a connection portion connecting to the two sealant nodes, wherein a width of one of the two sealant nodes is greater than a width of the connection portion, and the width of the connection portion is less than or equal to the width of the straight segment.

12. The display panel as claimed in claim 9, wherein the curved segment further comprises an overlapping portion connecting to the two sealant nodes, wherein a width of one of the two sealant nodes is greater than a width of the overlapping portion, and the width of the overlapping portion is greater than the width of the straight segment.

13. The display panel as claimed in claim 7, wherein an outer edge of one of the two sealant nodes comprises a first end point, a second end point, and a third end point, wherein the first and the second end points are separated by a predetermined distance, and the second and the third end points are separated by the predetermined distance;

wherein an inner edge of one of the two sealant nodes comprises a fourth end point, a fifth end point, and a sixth end point, wherein the fourth and the fifth end points are separated by the predetermined distance, and the fifth and the sixth end points are separated by the predetermined distance;

wherein an area enclosed by the first point, the second point, and the third point is greater than an area enclosed by the fourth point, the fifth point, and the sixth point.

14. A display panel, comprising:
a first substrate;
a second substrate, arranged opposite to the first substrate;
a display layer, positioned between the first substrate and the second substrate; and
a sealant, positioned between the first substrate and the second substrate and neighboring the display layer, the sealant comprising:
a first curved segment, comprising two first sealant nodes; and
a second curved segment, comprising two second sealant nodes;
wherein the first curved segment has a first rotation radius ($r_1$) and the second curved segment has a second rotation radius ($r_2$);
wherein the two first sealant nodes are spaced apart by a first distance ($D_1$), and the two second sealant nodes are spaced apart by a second distance ($D_2$);
wherein the first rotation radius ($r_1$) is greater than the second rotation radius ($r_2$), and the first distance ($D_1$) is greater than the second distance ($D_2$).

15. The display panel as claimed in claim 14, wherein the first rotation radius ($r_1$) and the second rotation radius ($r_2$) satisfy the equation: $0<r_2/r_1<1$, and the first distance ($D_1$) and the second distance ($D_2$) satisfy the equation: $0<D_2/D_1<1$.

16. The display panel as claimed in claim 14, wherein the sealant further comprises a straight segment connecting to the first curved segment and the second curved segment.

17. The display panel as claimed in claim 16, wherein a width of one of the two first sealant nodes is greater than a width of the straight segment, and a width of one of the two second sealant nodes is greater than the width of the straight segment.

18. The display panel as claimed in claim 16, wherein the first curved segment further comprises a connection portion connecting to the two first sealant nodes, wherein a width of one of the two first sealant nodes is greater than a width of the connection portion, and the width of the connection portion is less than or equal to a width of the straight segment.

19. The display panel as claimed in claim 16, wherein the second curved segment further comprises an overlapping portion connecting to the two second sealant nodes, wherein a width of one of the two second sealant nodes is greater than a width of the overlapping portion, and the width of the overlapping portion is greater than a width of the straight segment.

20. The display panel as claimed in claim 14, wherein an outer edge of one of the two second sealant nodes comprises a first end point, a second end point, and a third end point, wherein the first and the second end points are separated by a predetermined distance, and the second and the third end points are separated by the predetermined distance;

wherein an inner edge of one of the two second sealant nodes comprises a fourth end point, a fifth end point, and a sixth end point, wherein the fourth and the fifth end points are separated by the predetermined distance, and the fifth and the sixth end points are separated by the predetermined distance;

wherein an area enclosed by the first point, the second point, and the third point is greater than an area enclosed by the fourth point, the fifth point, and the sixth point.

* * * * *